United States Patent
Kawamura et al.

(10) Patent No.: US 10,696,852 B2
(45) Date of Patent: Jun. 30, 2020

(54) SILVER PASTE, AND CONDUCTIVE MOLDED ARTICLE OBTAINED USING SAME

(71) Applicant: DIC Corporation, Tokyo (JP)

(72) Inventors: Kaori Kawamura, Chiba (JP); Masayuki Moriwaki, Chiba (JP); Yoshiyuki Sano, Chiba (JP)

(73) Assignee: DIC CORPORATION, Tokyo (JP)

( * ) Notice: Subject to any disclaimer, the term of this patent is extended or adjusted under 35 U.S.C. 154(b) by 0 days.

(21) Appl. No.: 15/534,385

(22) PCT Filed: Dec. 8, 2015

(86) PCT No.: PCT/JP2015/084381
§ 371 (c)(1),
(2) Date: Jun. 8, 2017

(87) PCT Pub. No.: WO2016/093223
PCT Pub. Date: Jun. 16, 2016

(65) Prior Publication Data
US 2017/0342279 A1    Nov. 30, 2017

(30) Foreign Application Priority Data

Dec. 11, 2014  (JP) .................................. 2014-250844

(51) Int. Cl.

| | | |
|---|---|---|
| C09D 5/24 | (2006.01) | |
| H01B 1/22 | (2006.01) | |
| C08L 79/02 | (2006.01) | |
| C09D 7/61 | (2018.01) | |
| B22F 9/24 | (2006.01) | |
| C09D 179/02 | (2006.01) | |
| C09D 11/52 | (2014.01) | |
| H01B 5/14 | (2006.01) | |
| C09D 7/40 | (2018.01) | |
| B22F 9/20 | (2006.01) | |
| C09D 171/02 | (2006.01) | |
| C09D 163/00 | (2006.01) | |
| H01B 5/16 | (2006.01) | |
| B22F 1/00 | (2006.01) | |
| C09D 5/03 | (2006.01) | |
| H05K 1/09 | (2006.01) | |
| C08G 73/02 | (2006.01) | |
| B05D 1/00 | (2006.01) | |
| B05D 3/02 | (2006.01) | |
| B82Y 30/00 | (2011.01) | |
| C08K 3/08 | (2006.01) | |

(52) U.S. Cl.
CPC .............. *C09D 5/24* (2013.01); *B05D 1/005* (2013.01); *B05D 3/0254* (2013.01); *B22F 1/0018* (2013.01); *B22F 1/0022* (2013.01); *B22F 1/0062* (2013.01); *B22F 9/20* (2013.01); *B22F 9/24* (2013.01); *C08G 73/024* (2013.01); *C08G 73/0206* (2013.01); *C08L 79/02* (2013.01); *C09D 5/031* (2013.01); *C09D 7/40* (2018.01); *C09D 7/61* (2018.01); *C09D 11/52* (2013.01); *C09D 163/00* (2013.01); *C09D 171/02* (2013.01); *C09D 179/02* (2013.01); *H01B 1/22* (2013.01); *H01B 5/14* (2013.01); *H01B 5/16* (2013.01); *H05K 1/097* (2013.01); *B22F 2001/0066* (2013.01); *B22F 2301/255* (2013.01); *B82Y 30/00* (2013.01); *C08K 2003/0806* (2013.01); *C08K 2201/001* (2013.01)

(58) Field of Classification Search
None
See application file for complete search history.

(56) References Cited

U.S. PATENT DOCUMENTS

| | | | | |
|---|---|---|---|---|
| 8,277,693 B2 * | 10/2012 | Harada | ............... | B01F 17/0007 106/31.92 |
| 2010/0120960 A1 | 5/2010 | Lee et al. | | |
| 2011/0020170 A1 | 1/2011 | Luinstra et al. | | |
| 2011/0180764 A1 * | 7/2011 | Takahashi | ............. | B22F 1/0018 252/514 |

(Continued)

FOREIGN PATENT DOCUMENTS

| | | |
|---|---|---|
| EP | 1853671 A1 | 11/2007 |
| EP | 2444462 A1 | 4/2012 |
| JP | 2006-213887 A | 8/2006 |

(Continued)

OTHER PUBLICATIONS

Search Report issued in Corresponding International Patent Application No. PCT/JP2015/084381, dated Mar. 15, 2016.

(Continued)

*Primary Examiner* — Satya B Sastri
(74) *Attorney, Agent, or Firm* — McDermott Will & Emery LLP

(57) ABSTRACT

A problem is to provide a silver paste which can produce, without variation in resistivity value, a conductive silver coating film exhibiting resistivity substantially equivalent to the resistance value of bulk silver in low-temperature sintering. The problem is solved by providing a silver paste including a silver nanoparticle aqueous dispersion prepared by using a compound having a polyethyleneimine skeleton as a protective agent, a compound having a functional group reactable with nitrogen atoms in the polyethyleneimine, and at least one compound selected from the group consisting of a compound having an amine functional group and a compound having an amide functional group.

10 Claims, No Drawings

(56) References Cited

U.S. PATENT DOCUMENTS

2013/0048920 A1 2/2013 Inagaki et al.
2013/0056687 A1 3/2013 Inagaki et al.

FOREIGN PATENT DOCUMENTS

| JP | 2008-037884 A | 2/2008 |
|----|---------------|--------|
| JP | 2008-038180 A | 2/2008 |
| JP | 2008-045024 A | 2/2008 |
| JP | 2010-118168 A | 5/2010 |
| WO | 2008/143061 A1 | 11/2008 |
| WO | 2009/157309 A1 | 12/2009 |
| WO | 2011/078141 A1 | 6/2011 |
| WO | 2011078140 A1 | 6/2011 |

OTHER PUBLICATIONS

Extended European Search Report issued in corresponding European Patent Application No. 15866404.5, dated Apr. 4, 2018.

* cited by examiner

SILVER PASTE, AND CONDUCTIVE MOLDED ARTICLE OBTAINED USING SAME

CROSS REFERENCE

This application is the U.S. National Phase under 35 U.S.C. § 371 of International Application No. PCT/JP2015/084381, filed on Dec. 8, 2015, which claims the benefit of Japanese Application No. 2014-250844, filed on Dec. 11, 2014, the entire contents of each are hereby incorporated by reference.

TECHNICAL FIELD

The present invention relates to a silver paste which can produce, with no variation in resistivity, a silver coating film exhibiting high conductivity in low-temperature sintering and which contains a polymer compound containing a polyethylene imine skeleton, silver nanoparticles, and specified additives, and also relates to a low-temperature-sintering type electrically conductive formed product produced by using the paste.

BACKGROUND ART

In order to develop small, thin information devices having high integration and high performance, it is necessary to further develop a fine processing technique for electronic circuits and the like, and to provide a technique of fine processing at low cost and low energy. A technique which has recently attracted attention as a solving method is to form, at low cost and low energy, fine conductive wiring by using an ink using metal nanoparticles as a conductive material and printing with the ink. That is, because metal fine nanoparticles have high surface energy and thus cause a fusion temperature depression on particle surfaces, conductivity equivalent to that of bulk silver can be obtained by heating a coating film or printed matter at a low temperature of about 150° C., and fine wiring can be drawn on a substrate with low heat resistance, such as PET or the like. Therefore, the metal fine nanoparticles have a high utility value.

The inventors have already reported a metal nanoparticle dispersion including metal nanoparticles contained in a dispersion, which is formed by a polymer compound containing a polyalkyleneimine chain, a hydrophilic segment, and a hydrophobic segment in a solvent, and also reported a method for producing the metal nanoparticle dispersion (refer to, for example, Patent Literature 1). The metal nanoparticle dispersion is a dispersion formed by reducing metal ions by means of the strong reducing ability, coordinate bonding force, and electrostatic interaction of the polyalkyleneimine chain in the polymer compound used, and fixing the metal as nanoparticles in the dispersion. Even when the morphology of the dispersion is changed with contraction or the like of the polyalkyleneimine chain due to the specific functions of the polyalkyleneimine chain, the hydrophilic segment and the hydrophobic segment in the polymer compound exhibit excellent self-organization ability due to high affinity for the solvent and strong associative force by the interaction between the segments. Therefore, a stable dispersion state is maintained over a long period of time in the solvent without deterioration in dispersion stability as the dispersion.

Also, a formed product using the metal nanoparticle dispersion is reported (refer to, for example, Patent Literature 2). The formed product can be produced by using the metal nanoparticle dispersion as it is without the need for a complicated operation, but electric characteristics are unsatisfactory. For example, a resistance value of only $7.8 \times 10^{-4}$ Ω·cm is shown even by heat treatment at 200° C. for 30 minutes, and the resistance value is as high as a value of two-digit higher than $1.6 \times 10^{-6}$ Ω·cm of bulk silver. In addition, the requirement for high-temperature heat treatment makes it difficult to apply to a plastic substrate used for a flexible display and the like, and the lack of versatility causes the need for improvement.

In this situation, the inventors found and reported that a formed product having any desired shape and exhibiting high conductivity in low-temperature sintering without complicated treatment or the like can be produced by applying, on a substrate, a silver paste having a fusion temperature within a specified range and containing a silver nanoparticle dispersion, which is prepared by using a compound containing a polyethylene imine skeleton as a protective agent, and a compound having a functional group reactable with nitrogen atoms in the polyethyleneimine (refer to, for example, Patent Literature 3).

CITATION LIST

Patent Literature

PTL 1: Japanese Unexamined Patent Application Publication No. 2006-213887
PTL 2: Japanese Unexamined Patent Application Publication No. 2008-045024
PTL 3: Japanese Unexamined Patent Application Publication No. 2010-118168

SUMMARY OF INVENTION

Technical Problem

In the invention described in Patent Literature 3, a conductive silver coating film exhibiting resistivity substantially equivalent to the resistance value of bulk silver can be produced at a low temperature.

However, in order to prepare the silver paste described in Patent Literature 3 having a composition close to a practical situation, the inventors evaluated coating films by using compositions prepared by adding, to the silver paste, raw materials, materials, and solvents suitable for various purposes, and various additives such as a coupling agent, a crosslinking agent, a leveling agent, etc. As a result, it was found that some of the coating films exhibit good resistivity, and some of the coating films exhibit unsatisfactory resistivity. Because such variation occurs in resistivity value of the silver coating films, there is room for further improvement on the assumption of a practical situation.

Accordingly, a problem to be solved by the present invention is to provide a silver paste which can produce, without variation in resistivity value, a conductive silver coating film exhibiting resistivity substantially equivalent to the resistance value of bulk silver in low-temperature sintering.

Solution to Problem

As a result of earnest investigation for solving the problem, the inventors found that the problem can be solved by providing a silver paste containing a silver nanoparticle aqueous dispersion, which is prepared by using a compound containing a polyethyleneimine skeleton as a protective agent, and a compound having a functional group reactable with nitrogen atoms in the polyethyleneimine, and further containing at least one compound selected from the group consisting of a compound having an amine functional group and a compound having an amide functional group, leading to the achievement of the present invention.

That is, the present invention provides a silver paste containing an aqueous dispersion of a silver-containing structure containing, as main constituent components, at least one compound (X) selected from the group consisting of a compound (x1) containing polyethyleneimine (a) having a number-average molecular weight of 500 to 50,000 and an amino group to which polyethylene glycol (b) having a number-average molecular weight of 500 to 5,000 is bonded, a compound (x2) containing polyethyleneimine (a) having a number-average molecular weight of 500 to 50,000 and an amino group to which a linear epoxy resin (c) is bonded, and a compound (x3) containing polyethyleneimine (a) having a number-average molecular weight of 500 to 50,000 and an amino group to which polyethylene glycol (b) having a number-average molecular weight of 500 to 5,000 and a linear epoxy resin (c) are bonded, and silver nanoparticles (Y);

a compound (Z) having a functional group reactable with a nitrogen atom in the polyethyleneimine (a); and at least one compound (W) selected from the group consisting of a compound (w1) having an amine functional group and a compound (w2) having an amide functional group.

Also, the present invention provides an electrically conductive formed product including a coating film provided on a solid substrate and having a fusion temperature of 100° C. to 150° C., the coating film containing:

at least one compound (X) selected from the group consisting of a compound (x1) containing polyethyleneimine (a) having a number-average molecular weight of 500 to 50,000 and an amino group to which polyethylene glycol (b) having a number-average molecular weight of 500 to 5,000 is bonded, a compound (x2) containing polyethyleneimine (a) having a number-average molecular weight of 500 to 50,000 and an amino group to which a linear epoxy resin (c) is bonded, and a compound (x3) containing polyethyleneimine (a) having a number-average molecular weight of 500 to 50,000 and an amino group to which polyethylene glycol (b) having a number-average molecular weight of 500 to 5,000 and a linear epoxy resin (c) are bonded;

silver nanoparticles (Y);

a compound (Z) having a functional group reactable with a nitrogen atom in the polyethyleneimine (a); and at least one compound (W) selected from the group consisting of a compound (w1) having an amine functional group and a compound (w2) having an amide functional group.

Advantageous Effects of Invention

A silver paste according to the present invention can produce, without variation in resistivity, a conductive silver coating film exhibiting resistivity substantially equivalent to the resistance value of bulk silver in low-temperature sintering. Thus, the silver paste of the present invention is very excellent in view of the point that it can be applied to a composition close to a practical situation, for example, an ink composition or the like.

DESCRIPTION OF EMBODIMENTS

The present invention is described in detail below.

A silver paste of the present invention contains an aqueous dispersion of a silver-containing structure containing, as main constituent components, at least one compound (X) selected from the group consisting of a compound (x1) containing polyethyleneimine (a) having a number-average molecular weight of 500 to 50,000 and an amino group to which polyethylene glycol (b) having a number-average molecular weight of 500 to 5,000 is bonded, a compound (x2) containing polyethyleneimine (a) having a number-average molecular weight of 500 to 50,000 and an amino group to which a linear epoxy resin (c) is bonded, and a compound (x3) containing polyethyleneimine (a) having a number-average molecular weight of 500 to 50,000 and an amino group to which polyethylene glycol (b) having a number-average molecular weight of 500 to 5,000 and a linear epoxy resin (c) are bonded, and silver nanoparticles (Y);

a compound (Z) having a functional group reactable with a nitrogen atom in the polyethyleneimine (a); and at least one compound (W) selected from the group consisting of a compound (w1) having an amine functional group and a compound (w2) having an amide functional group.

The "silver nanoparticles (Y)" in the present invention represents that the average particle diameter (an average value of 100 particles randomly extracted) observed in a transition electron microscope photograph is 100 nanometers or less, and the shape need not be a perfectly spherical shape.

In addition, the number-average molecular weight of each of the segments constituting the compound (X) is a value measured by gel permeation chromatography (GPC) in terms of polystyrene.

Further, the silver-containing structure containing the compound (X) and the silver nanoparticles (Y) as the main constituent components has a nanometer-order structure and is composed of the compound (X) and the silver nanoparticles (Y) other than impurities mixed due insufficient purification in a purification process unless a third component such as an additive or the like is intentionally mixed. Even when an additive or the like is mixed, the total mass ratio of the compound (X) and the silver nanoparticles (Y) in the silver-containing structure is 90% by mass or more.

The polyethyleneimine (a) constituting the compound (X) used in the present invention is a polymer chain in which an ethyleneimine unit can be coordinately bonded to silver and silver ions, reduction of silver ions is accelerated to produce the silver nanoparticles (Y), and the silver nanoparticles (Y) are stabilized and maintained. The structure thereof has the ethyleneimine unit as a main repeating unit and may be linear or branched, and a commercial product or a synthetic product may be used.

The size of the silver-containing structure used in the present invention is influenced not only by the molecular weight of the compound (X), but also by the structure and composition ratio of each of the components constituting the compound (X), that is, the polyethyleneimine (a), the polyethylene glycol (b), and the linear epoxy resin (c), and the type of the silver compound used as a raw material. If polyethyleneimines (a) have the same molecular weight, a low branching degree results in the structure having a large particle diameter, and the particle diameter tends to decrease with increases in the branching degree. Further, in order to increase the content of the silver nanoparticles (Y), branched polyethyleneimine is preferably used.

General commercial branched polyethyleneimine is branched by a tertiary amine and can be used as a raw material of the compound (X) used in the present invention. From the viewpoint of producing the aqueous dispersion of the silver-containing structure having excellent storage stability and a preferred particle diameter, the branching degree represented by a molar ratio of (tertiary amine)/(all amines) is preferably a branching degree within a range of (1 to 49)/(100). Also, in view of industrial production, easy availability, etc., the branching degree is more preferably within a range of (15 to 40)/(100).

When the number-average molecular weight of the polyethyleneimine (a) segment is excessively low, the capacity of retaining the silver nanoparticles (Y) by the compound (X) is easily decreased, and storage stability may became unsatisfactory. While when the number-average molecular weight is excessively high, the compound (X) becomes a huge association and thus interferes with storage stability of the dispersion in some cases. Therefore, in order to produce the aqueous dispersion of the silver-containing structure excellent in the ability of fixing the silver nanoparticles (Y) in the aqueous dispersion of the resultant silver-containing structure, the ability of preventing particle growth in size in the dispersion, etc., the number-average molecular weight of the polyethyleneimine (a) is required to be within a range of 500 to 50,000, and is preferably within a range of 1,000 to 40,000 and most preferably within a range of 1,800 to 30,000.

The polyethylene glycol (b) constituting the compound (x1) and the compound (x3) used in the present invention serves as a hydrophilic segment which promotes storage stability in a hydrophilic solvent. When the molecular weight of the polyethylene glycol (b) is excessively low, dispersion stability for dispersion in a hydrophilic solvent is degraded, while when the molecular weight is excessively high, it is considered possible that the structures are aggregated. Therefore, in order to produce the aqueous dispersion of the silver-containing structure having more excellent storage stability, the number-average molecular weight of the polyethylene glycol (b) is required to be within a range of 500 to 5,000 and is preferably 1,000 to 3,000.

The polyethylene glycol (b) may be a general commercial product or a synthetic product. Also, a copolymer with another hydrophilic polymer or the like may be used. Examples of the hydrophilic polymer which can be used include polyvinyl alcohol, polyacrylamide, polyisopropyl acrylamide, polyvinylpyrrolidone, and the like. Even when the copolymer is used, the molecular weight of the whole is preferably within a range of 500 to 5,000 from the viewpoint of increasing the silver content in the resultant silver-containing structure.

The compound (x2) and the compound (x3) used in the present invention each contain the linear epoxy resin (c) bonded as a hydrophobic segment. Since the compound (x2) and the compound (x3) each contain a structure derived from the linear epoxy resin (c), when the compound (x2) and the compound (x3) are dispersed in water or a hydrophilic solvent, micelle cores are formed by strong intramolecular or intermolecular associative force, and stable micelles are formed, thereby permitting the production of the sable dispersion containing the silver nanoparticles (Y) incorporated in the micelles.

The linear epoxy resin (c) is not particularly limited, and any one with a general commercial structure or synthesizable structure can be used. Examples of thereof include bisphenol A epoxy resins, bisphenol F epoxy resins, biphenyl-type epoxy resins, naphthalene-type epoxy resins, xanthene-type epoxy resins described in Japanese Unexamined Patent Application Publication No. 2003-201333, and the like. These may be used alone or as a mixture of two or more. Among these, bisphenol A epoxy resins are preferably used from the viewpoint of excellent adhesion to a substrate or the like when the resultant silver-containing dispersion is used as a silver paste. The linear epoxy resin may be directly used as a raw material of the compound (x2) or the compound (x3), and further various modifications may be added according to the structure or the like of the compound (x2) or compound (x3) to be desired.

Also, the molecular weight of the linear epoxy resin (c) is not particularly limited, but when the resin is dispersed in a hydrophilic organic solvent, an excessively low molecular weight is considered to possibly cause deterioration in dispersion stability, while an excessively high molecular weight is considered to possibly cause aggregation of the micelles. From this viewpoint, the number-average molecular weight of the linear epoxy resin (c) is generally 350 to 20,000 and preferably 400 to 10,000.

A method for producing the compound (X) used in the present invention is not particularly limited, but a method described below is preferred in view of the point that the compound can be easily synthesized according to design.

As described above, a commercial or synthetic product can be preferably used as the polyethyleneimine (a). First, the use of branched polyethyleneimine is described.

The branched polyethyleneimine is terminated by a primary amine, and thus the compound (x1) which can be used in the present invention can be synthesized by previously modifying an end of the polyethylene glycol (b) to a functional group reactive with a primary amine and reacting with the primary amine. Examples of the functional group reactive with the primary amine include, but are not particularly limited to, an aldehyde group, a carboxyl group, an isocyanate group, a tosyl group, an epoxy group, a glycidyl group, an isothiocyanate group, halogen, acid chlorides, sulfonic acid chloride, and the like. Among these, a carboxyl group, an isocyanate group, a tosyl group, an epoxy group, and a glycidyl group are preferred functional groups because they are advantageous for production in view of reactivity, handleability, etc.

The functional group is not limited to that which directly reacts with the primary amine, and any functional group may be used as long as it can be modified to a functional group reactable with the primary amine by various treatments. For example, if polyethylene glycol having a hydroxyl group is used, it may be reacted with the polyethyleneimine by a method such as reaction with glycidyl groups or the like. Also, the compound (x1) can be synthesized by performing treatment to convert the primary amine of the branched polyethyleneimine to another functional group reactable with polyethylene glycol having a functional group, and then reacting these together.

When the polyethyleneimine (a) is linear polyethyleneimine, the linear polyethyleneimine can be produced by a method of first synthesizing an acylated polyethyleneimine chain by living polymerization, then producing a polymer compound by introducing polyethylene glycol, and then hydrolyzing the acylated polyethyleneimine chain.

Also, a method for synthesizing the compound (x2) used in the present invention has already been provided by the inventors in Japanese Unexamined Patent Application Publication No. 2007-197503, and thus the compound having a molecular weight within a specified range may be synthesized by referring to this method.

A method for synthesizing the compound (x3) used in the present invention has already been provided by the inventors in Patent Literatures 1 and 2 etc. and thus the compound having a molecular weight within a specified range may be synthesized by referring to this method.

The molar ratio (a):(b) between the polymers constituting the chains of the components of the polyethyleneimine (a) and the polyethylene glycol (b) in the compound (x1) used in the present invention is not particularly limited. However, in view of excellent dispersion stability and storage stability of the aqueous dispersion of the resultant silver-containing structure, (a):(b)=generally within a range of 1:1 to 100 and particularly preferably designed to be 1:1 to 30.

Also, when the compound (x2) is used, the molar ratio (a):(c) between the polymers constituting the chains of the components of the polyethyleneimine (a) and the linear epoxy resin (c) is not particularly limited. However, in view of excellent dispersion stability and storage stability of the aqueous dispersion of the resultant silver-containing structure, (a) (c)=generally within a range of 1:1 to 100 and particularly preferably designed to be 1:1 to 30.

Also, when the compound (x3) is used, the molar ratio (a):(c):(c) between the polymers constituting the chains of the components of the polyethyleneimine (a), the polyethylene glycol (b), and the linear epoxy resin (c) is not particularly limited. However, in view of excellent dispersion stability and storage stability of the aqueous dispersion of the resultant silver-containing structure, (a):(b):(c)=generally within a range of 1:1 to 100:1 to 100 and particularly preferably designed to be 1:1 to 30:1 to 30.

The compound (X) used in the present invention has a structure in addition to the polyethyleneimine (a) which allows the silver nanoparticles (Y) to be stably present. That is, the compound (x1) has a structure derived from the polyethylene glycol (b), the compound (x2) has a structure derived from the linear epoxy resin (c), and the compound (x3) has structures derived from the polyethylene glycol (b) and the linear epoxy resin (c). As described above, a portion of the polyethylene glycol (b) exhibits high affinity for a solvent in a hydrophilic organic solvent and a portion of the linear epoxy resin (c) exhibits strong associative force in a hydrophilic organic solvent. Further, when the linear epoxy resin (c) has an aromatic ring, interaction between the it electrons possessed by the aromatic ring and silver is considered to contribute to further stabilization of the aqueous dispersion of the silver-containing structure.

The production method of the present invention includes first dissolving or dispersing the compound (X) in an aqueous medium, that is, water or a mixed solvent of water and a hydrophilic organic solvent. Solubility or dispersibility in the aqueous medium varies with the combination of the polyethyleneimine (a) and the polyethylene glycol (b) in the compound (x1), the combination of the polyethyleneimine (a) and the linear epoxy resin (c) in the compound (x2), and the combination of the polyethyleneimine (a), the polyethylene glycol (b), and the linear epoxy resin (c) in the compound (x3). However, it is necessary to uniformly dissolve or disperse the compound (X). Any hydrophilic organic solvent can be used as long as it can be mixed in an amount of at least 5 parts by mass relative to 100 parts by mass of water at 25° C. to 35° C. to prepare a uniform mixed solvent. Examples thereof include methanol, ethanol, isopropyl alcohol, n-propyl alcohol, tetrahydrofuran, dioxane, acetone, methyl ethyl ketone, dimethyl acetamide, dimethyl formamide, ethylene glycol, propylene glycol, ethylene glycol monomethyl ether, propylene glycol monomethyl ether, ethylene glycol dimethyl ether, propylene glycol dimethyl ether, diethylene glycol, glycerin, dimethyl sulfoxide, dioxirane, N-methylpyrrolidone, dimethylimidazolidinone, sulfolane, and the like. These may be used alone or as a mixture of two or more. Also, any one of various ionic liquids may be used.

The compound (X) and the aqueous medium are preferably used at a ratio such that the concentration of the compound (X) is 1% to 20% by mass and more preferably 2% to 15% by mass from the viewpoint of handleability and ease of reduction reaction of silver ions, and the viewpoint of improving the silver content in the resultant silver-containing structure. When solubility or dispersibility of the compound (X) is unsatisfactory, solubility or dispersibility can be adjusted by using a mixed solvent also containing ethyl acetate, propyl acetate, butyl acetate, isobutyl acetate, ethylene glycol monomethyl ether acetate, propylene glycol monomethyl ether acetate, or the like. The compound (X) may be generally dissolved or dispersed by standing or stirring at room temperature (25° C.), and if required, ultrasonic treatment, heating treatment, or the like may be performed. When the compound (X) has low affinity for the aqueous medium due to crystallinity or the like, for example, a method which may be used is to dissolve or swell the compound (X) with a small amount of good solvent and then disperse in the intended aqueous medium. This method is made more effective by performing ultrasonic treatment or heating treatment (to about 80° C.)

A solution or dispersion of the compound (X) is prepared and then mixed with a silver compound. In this case, the silver compound is preferably used so that the amount of silver is 400 to 9900 parts by mass relative to 100 parts by mass of the compound (X) from the viewpoint of increasing the silver content in the resultant silver-containing structure. Further, the silver compound is preferably mixed so that the nonvolatile content is 2% to 80% by mass from the viewpoint of increasing productivity by reducing the amount of the aqueous medium used and facilitating the control of reduction reaction. The silver compound is more preferably used so that the amount of silver is 900 to 9900 parts by mass relative to 100 parts by mass of the compound (X) and the nonvolatile content is 3% to 50% by mass.

In this case, any silver compound may be used as long as the silver nanoparticles (Y) can be obtained by reduction reaction, and examples thereof include silver nitrate, silver oxide, silver acetate, silver fluoride, silver acetylacetonate, silver benzoate, silver carbonate, silver citrate, silver hexafluorophosphate, silver lactate, silver nitrite, silver pentafluoropropionate, and the like. From the viewpoint of handleability and industrial easy availability, silver nitrate or silver oxide is preferably used.

A method for mixing the silver compound with the aqueous medium in which the compound (X) is dissolved or dispersed in the step described above is not particularly limited, and the method may be a method of adding the silver compound to the medium in which the compound (X) is dissolved or dispersed, a method of adding in a reverse way, or a method of mixing while simultaneously adding to separate containers. Also, the method of mixing by stirring or the like is not particularly limited.

In this method, in order to accelerate the reduction reaction, if required, heating to about 30° C. to 70° C. may be performed, or a reducing agent may be used simultaneously.

In view of the point that the reduction reaction can be easily controlled, and the reducing agent can be removed from the reaction system in a subsequent purification step, examples of the reducing agent which can be preferably used include, but are not particularly limited to, hydrogen, boron compounds such as sodium borohydride, ammonium borohydride, and the like; alcohols such as methanol, ethanol, propanol, isopropyl alcohol, ethylene glycol, propylene glycol, and the like; aldehydes such as formaldehyde, acetaldehyde, propionaldehyde, and the like; acids such as ascorbic acid, citric acid, sodium citrate, and the like; hydrazines such as hydrazine, hydrazine carbonate, and the like. Among these, sodium borohydride, ascorbic acid, sodium citrate, and the like are preferred in view of industrial easy availability, handleability, etc.

The amount of the reducing agent added is not particularly limited as long as it is equal to or more than an amount necessary for reducing silver ions, and the upper limit is not particularly specified but is preferably 10 mole times or less and more preferably 2 mole times or less the silver ions.

A method for adding the reducing agent is not particularly limited, and for example, the reducing agent can be mixed as it is or as an aqueous solution or a solution or dispersion in another solvent. Also, the order of adding the reducing agent is not limited, and the reducing agent may be previously added to a solution or dispersion of the compound (X) or may be added at the same time as mixing with the silver compound. Further, the method may be one in which a solution or dispersion of the compound (X) is mixed with the silver compound, and then the reducing agent is mixed after the passage of several hours.

In particular, when a raw material insoluble or slightly soluble in the aqueous medium, such as silver oxide, silver chloride, or the like, is used, a complexing agent may be combined. Examples of the complexing agent include propylamine, butylamine, diethylamine, dipropylamine, triethylamine, ammonia, ethylenediamine, N,N,N',N'-tetramethyl ethylenediamine, 1,3-diaminopropane, N,N,N',N'-tetramethyl-1,3-diaminopropane, triethylene tetramine, methylaminoethanol, dimethylaminoethanol, ethanolamine, diethanolamine, methyldiethanolamine, propanolamine, butanolamine, dimethylaminopropanol, and the like.

The amount of the complexing agent added may be an amount sufficient for forming a complex by coordination to silver oxide or the like, and the upper limit is not particularly specified but is preferably 40 mol times or less and more preferably 20 mol times or less the silver oxide or the like used. A method for adding the complexing agent is not limited and, for example, the complex agent can be mixed directly or in the form of an aqueous solution or a solution or dispersion in another solvent.

The time required for reduction reaction depends on the presence of the reducing agent, the type of the compound (X) used, or the like, but is generally 0.5 to 48 hours and preferably adjusted to 0.5 to 24 hours from the viewpoint of industrial productivity. The time can be adjusted by, for example, a method of adjusting the heating temperature, the amounts of the reducing agent and complexing agent added, the adding time, or the like.

In the purification step after the reduction reaction, concentration is preferably performed after addition of an organic solvent. The concentration method is not particularly limited, and any one of dialysis, centrifugal separation, and precipitation methods may be used or these methods may be simultaneously used. The organic solvent which can be used is not particularly limited, but an organic solvent having a boiling point of 120° C. or less and more preferably 100° C. or less is preferred in view of the point that the time required for the concentration step can be reduced, the organic solvent can be reused, and the mixture prepared in the previous step can be easily mixed. The amount of use is not particularly limited, but the mixing amount is 1.5 to 5 times and preferably 2 to 3 times the mixture prepared in the previous step.

A centrifugal separation method is preferably used as the concentration method in view of excellent industrial productivity. The centrifugal separation method is performed for the purpose of removing a portion of the medium used in the previous step and the reducing agent, the complexing agent, counter ions of silver ions, etc. added according to demand. Therefore, the concentration method according to the raw material used in the previous step is preferably used, and concentration is performed until the nonvolatile content is 30% by mass or more and preferably 50% by mass or more.

In general, metal nanoparticles within a size region of several tens nm have characteristic optical absorption due to surface plasmon excitation according to the metal species. Therefore, it can be confirmed by measuring plasmon absorption of the dispersion that silver is present as nanometer-order fine particles in the resultant dispersion. Further, the average particle diameter, distribution width, and the like can be observed by using a TEM (transmission electron microscope) photograph or the like of a film formed by casting the dispersion.

The concentrate produced as described above can be directly supplied as the "aqueous dispersion of the silver-containing structure" in a next step. Any one of the following methods may be used: a method of properly adding a desired aqueous dispersion to the concentrate of one time of concentration and stirring and mixing the resultant mixture to prepare an aqueous dispersion of a silver-containing structure, and a method of powdering the concentrate by vacuum drying, freeze drying, or the like and then dispersing the resultant powder in a desired aqueous medium to prepare a new "aqueous dispersion".

The silver paste of the present invention can be produced by adding, to the "aqueous dispersion" of the silver-containing structure produced as described above, a compound (Z) having a functional group reactable with nitrogen atoms in the polyethyleneimine (a) and at least one compound (W) selected from the group consisting of a compound (w1) having an amine functional group and a compound (w2) having an amide functional group. An addition method is not particularly method, and for example, the compound (Z) and the compound (W) can be mixed as they are or mixed in the form of an aqueous solution or a solution or dispersion in another solvent.

The compound (Z) used in the present invention is not particularly limited, and any compound can be used as long as it has a general commercial or synthesizable structure. Specifically a compound which forms an alcohol, an amide bond, or quaternary ammonium ions by reaction with nitrogen atoms in the polyethyleneimine (a), such as an aldehyde compound, an epoxy compound, an acid anhydride, a carboxylic acid, an inorganic acid, or the like, can be used. Examples thereof include formaldehyde, acetaldehyde, propionaldehyde, acrolein, benzaldehyde, cinnamaldehyde, perillaldehyde, ethylene oxide, propylene oxide, butylene oxide, 2,3-butylene oxide, isobutylene oxide, 1-methoxy-2-methylpropylene oxide, butyric acid-glycidyl ester, glycidyl methyl ether, 1,2-epoxyhexane, 1,2-epoxyheptane, 1,2-epoxyoctane, 1,2-epoxydecane, 1,2-epoxydodecane, 1,4-butanediol diglycidyl ether, 1,2-epoxy-5-hexene, 1,2-epoxy-9-decene, 2-phenylpropylene oxide, stilbene oxide, glycidyl methyl ether, ethyl glycidyl ether, butyl glycidyl ether, glycidyl isopropyl ether, tert-butyl glycidyl ether, allyl glycidyl ether, glycidyl phenyl ether, benzyl glycidyl ether, glycidyl stearate, epoxysuccinic acid, 1,5-hexadiene diepoxide, 1,7-octadiene diepoxide, 2,2-bis(4-glycidyloxyphehyl)propane, ethylene glycol diglycidyl ether, neopentyl glycol glycidyl ether, acetic anhydride, maleic anhydride, citraconic anhydride, diacetyl-tartaric anhydride, phthalic anhydride, 1,2-cyclohexanedicarboxylic anhydride, 1-cyclohexene-1,2-dicarboxylic anhydride, o-acetyl-malic anhydride, (2-methyl-2-propenyl) succinic anhydride, 1,2-naphthalic anhydride, 2,3-naphthalenedicarboxylic anhydride, 2,3-anthracenedicarboxylic anhydride, 2,3-dimethylmaleic anhydride, 3-methylglutaric anhydride, 3-methylphthalic anhydride, 4-methoxybenzoic anhydride, 4-methylphthalic anhydride, benzoic anhydride, succinic anhydride, butylsuccinic anhydride, decylsuccinic anhydride, dodecylsuccinic anhydride, hexadecylsuccinic anhydride, octadecylsuccinic anhydride, octadecenylsuccinic anhydride, isooctadecenylsuccinic anhydride, tetradecenylsuccinic anhydride, nonylsuccinic anhydride, trimellitic anhydride, butyric anhydride, propionic anhydride, heptanoic anhydride, decanoic anhydride, n-octanoic anhydride, nonanoic anhydride, oleic anhydride, valeric anhydride, palmitic anhydride, phenoxyacetic anhydride, pivalic anhydride, stearic anhydride, crotonic anhydride, diglycolic anhydride, glutaric anhydride, exo-3,6-epoxy-1,2,3,6-tetrahydrophthalic anhydride, itaconic anhydride, formic acid, acetic acid, propionic acid, ascorbic acid, citric acid, tartaric acid, maleic acid, fumaric acid, succinic acid, oxalic acid, benzoic acid, para-toluenesulfonic acid, glucuronic acid, hyaluronic acid, gluconic acid, hydrogen peroxide, phosphoric acid, nitric acid, nitrous acid, boric acid, and the like. These may be used alone or as a mixture of two or more.

The compound (Z) is preferably used so that the amount of the compound (Z) added is 0.8% to 1.4% by weight relative to the silver solid content in the aqueous dispersion.

The compound (W) used in the present invention is a compound selected from the group consisting of the compound (w1) having an amine functional group and the compound (w2) having an amide functional group.

Specific examples thereof include a water-soluble amine compound, a water-soluble alcoholamine compound, a water-soluble amide compound, and the like, and more specific examples include a water-soluble amine compound having an alkyl group having 1 to 6 carbon atoms, a water-soluble ethanolamine compound having an alkyl group having 1 to 4 carbon atoms, a water-soluble amide compound having a dimethyl group or diethyl group on a nitrogen atom, and the like.

Among these, the water-soluble amine compound is preferably methylamine, ethylamine, propylamine, isopropylamine, n-butylamine, isobutylamine, tert-butylamine, dimethylamine, diethylamine, trimethylamine, trimethylamine, or the like, the water-soluble alcoholamine compound is preferably dimethylaminoethanol, diethylaminoethanol, or the like, and the water-soluble amide compound is preferably N,N-dimethylformamide, N,N-diethylformamide, N,N-dimethylacetamide, N,N-diethylacetamide, N,N-dimethylpropionamide, or the like.

These may be used alone or as a mixture of two or more.

The description "n-butylamine" represents normal-butylamine, and the description "tert-butylamine" represents tertiary-butylamine.

The compound (W) is preferably used so that the amount of the compound (W) added is 1.0% to 9.0% by weight relative to the silver solid content in the aqueous dispersion in view of the point that a more excellent effect can be obtained.

In addition, when the compound (Z) and the compound (W) are added to the aqueous dispersion, both may be added simultaneously or added with a time interval therebetween, or a mixture previously prepared by mixing the compound (Z) and the compound (W) may be added.

The fusion temperature of the silver-containing structure containing the compound (X) and the silver nanoparticles (Y) as the main constituent components is 130° C. to 160° C. However, the silver paste of the present invention having a fusion temperature decreased by as large as 20° C. to 30° C. in a dry state can be produced by adding the compound (Z) having a functional group reactable with nitrogen atoms in the polyethyleneimine (a) to the aqueous dispersion of the silver-containing structure. The fusion temperature in a dry state of the silver paste is within a range of 100° C. to 150° C. and preferably within a range of 100° C. to 130° C.

The fusion temperature in a dry state represents the fusion temperature determined by DSC measurement in a state without flowability, in which the solvent or the like is evaporated from the silver paste.

In addition, when the silver paste may be practically used by mixing with various additives such as a crosslinking agent, a leveling agent, etc. as described below.

In this case, it can be estimated that adding the compound (Z) and the compound (W) allows the following two mechanisms to simultaneously proceed:

(1) a mechanism in which silver and oxide films on the surfaces of silver nanoparticles are dissolved with the compound (Z), and fusion is allowed to proceed by reduction of the compound (W); and (2) a mechanism in which a nitrogen atom contained in the compound (X) as the protective agent forms a salt with the compound (Z), the compound (X) is separated from the surfaces of silver nanoparticles, and the excessive separated protective agent having amine is aggregated, thereby progressing fusion. Even when a silver coating film is formed by using a composition mixed with the additives, no variation occurs in the resistivity value, and very excellent resistivity can be stably obtained.

An electrically conductive formed product of the present invention can be produced by applying the silver paste produced as described above on a solid substrate. Examples of the application method include, but are not particularly limited to, a method using a spin coater, a bar coater, an applicator, various printing machines, a printer, a dispenser, or the like, a method by dipping in a silver paste, a method using a flow gun, a flow coater, or the like, a spray method using a spray or the like, a method of brushing, puff coating, roller coating, or the like. The shape which can be formed by coating is a solid shape, lines with various thicknesses, a fine pattern shape, a design, or the like, and any one of the shapes can be formed by selecting a method from various methods according to purposes.

The silver paste of the present invention has excellent adhesion to the solid substrate, but any desired component selected according to purpose may be mixed. Examples of the component which can be mixed include, but are not particularly limited to, components for electronic materials, such as various conductive material components, components for improving affinity and adhesion to electronic materials; components for coating, such as components for improving affinity and adhesion to substrates, components for smoothening or controlling irregularities on surfaces, solvents having various boiling points, and the like; components for bonding, such as components for improving adhesion or adhesiveness to various joined products, a viscosity adjuster, and the like; colored components for coloring agents, such as various polymers, ceramics, and the like; components for three-dimensional formed products such as a container, a structure, and the like, such as various polymers, a coupling agent, a crosslinking agent, and the like. That is, raw materials, materials, and solvents suitable for various purposes, and various additives such as a coupling agent, a crosslinking agent, a leveling agent, and the like can be mixed.

The silver paste of the present invention can be formed into an ink by a known common method. For example, as described below in an example, a conducive ink can be prepared by adding a leveling agent such as a polyhydric alcohol, a nonionic surfactant, or the like. Further, if required, known common additives for improving printability and coating film characteristics, such as a defoaming agent, a surfactant, a rheology adjuster, and the like, can be contained in a use amount within a range which causes no adverse effect on the dispersion stability, substrate wettability, and leveling property of an ink, and the performance of a coating film after sintering.

The electrically conductive formed product of the present invention is produced by drying the solid substrate after the application of the silver paste prepared as described, and a drying method is not particularly limited. Examples thereof include a method in which a coating film, coating, or laminate formed by casting the silver paste on the substrate, a formed product formed by filling a mold, a mold form, or the like with the silver paste, or the like is dried by using any one of various heating devices such as an electric furnace, a dryer, an oven, a constant-temperature bath, a hot stage, or the like; a method in which the silver paste is molded while being heated by using an injection molding machine, an extrusion molding machine, a compression molding machine, a blow molding machine, or the like; a method of natural drying at room temperature of 25° C. to 30° C., and the like. The drying conditions are not particularly limited but are preferably appropriately selected according to purposes of use, the solid substrate and additives used, etc. The drying temperature is required to be within a range of 25° C. to 150° C. and is preferably within a range of 80° C. to 150° C. in view of the point that even when the solid substrate used in the present invention has a relatively low glass transition temperature of, for example, 180° C. or less, the substrate can be used, and the point that when the temperature during drying is excessively low, the solvent or the like remaining in the silver paste is not sufficiently removed, and thus characteristics such as conductivity and the like may not be sufficiently exhibited. The film of the electrically conductive formed product of the present invention is formed by drying the silver paste. In this case, a new compound may be formed by partial reaction between the compound (X) and the compound (Z) [particularly, when a compound having a relatively high molecular weight and low volatility, such as an epoxy compound or the like, is used as the compound (Z)], and the compound (Z) may be contained in a state of being partially decomposed by a sintering temperature (particularly, when a low-molecular-weight organic acid or inorganic acid is used). The present invention includes these modifications.

The shape, material, and the like of the solid substrate used for the electrically conductive formed product of the present invention are not particularly limited as long as the silver paste can be applied and adsorbed. Examples of the shape which can be used include simple shapes such as a film shape, a sheet shape, a plate-like shape, a three-dimensional formed product, and the like, and complicated shapes with an engraving or the like. The substrate with any one of various surface shapes, such as a smooth surface, an embossed surface, a surface with complicated irregularity, and the like, can be used. With respect to the material, examples of the substrate which can be used include a substrate composed of an organic material such as a polymer or the like, a substrate composed of an inorganic material such as glass, a metal, ceramic, or the like, a substrate composed of a hybrid material produced by mixing the these materials, and the like. Typical examples of the substrate include organic substrates using various polymers such as polyethylene, polypropylene, polycarbonate, polyester, polystyrene, unsaturated polyester resins, vinyl chloride resins, epoxy resins, phenol resins, melamine resins, urea resins, AS resins, ABS resins, poly(meth)acrylate, poly(meth)acrylamide, polyvinylalcohol, vinylidene chloride resins, acetal resins, polyamide, polyurethane, polyethylene terephthalate, polybutylene terephthalate, polyimide, liquid crystal polymers, polyphenylene sulfide, polysulfone, and the like, wood, or the like; substrates produced by mixing these organic materials; inorganic substrates each containing aluminum, iron, stainless steel, copper, lead, titanium, a cast metal, any one of various alloys produced by combining various metals, a semiconductor such as silicon, ceramic, glass, or the like; and the like. The silver paste of the present invention has the characteristic of exhibiting conductivity at a low temperature of 150° C. or less and thus can be preferably used even for the solid substrate having a glass transition temperature of 180° C. or less.

The electrically conductive formed product of the present invention is produced by applying the silver paste on the substrate, and a silver paste layer is laminated on the substrate or an organic-inorganic composite layer is laminated on the substrate by fusion, crystallization, or the like of the silver nanoparticles due to heat treatment or drying treatment. The silver paste layer or the organic-inorganic composite layer may be a metal laminate obtained by repeatedly applying, multiple times, the same or different silver paste layers or organic-inorganic composite layers. In this case, the shapes, areas, thicknesses, conditions, methods, etc. of the application may be the same or different. Further, another layer of a material not containing the silver nanoparticles or a component produced by fusion or crystallization or the like due to the treatment can be interposed between the same or different silver paste layers or organic-inorganic composite layers repeatedly applied.

In addition, treatment such as dehydration, solvent removal, natural drying, freeze drying, heating, ultraviolet irradiation, electron beam irradiation, or the like can be performed before, during, or after the various molding steps described above according to various purposes. These treatment methods can be used without being particularly limited.

The form of the formed product of the present invention produced by the production method described above is not particularly limited. Examples of the shape of the formed product produced by using the typical examples described above include a coating film, a film, a coating, a joined material, a laminated plate, a sealed material, a film, a sheet, a board, a fibrous product, a tube-shaped formed product, a three-dimensional formed product, a gel-like formed product, a sold sol-like formed product, and the like.

The conductivity of the electrically conductive formed product of the present invention is $1\times10^{-3}$ Ω·cm or less, preferably $1\times10^{-4}$ Ω·cm or less, and more preferably $1\times10^{-5}$ Ω·cm or less in terms of specific volume resistivity. In order to obtain such conductivity, it has been considered necessary to remove a protective agent [corresponding to the compound (X) in the present invention] in a metal nanoparticle dispersion. Therefore, Japanese Unexamined Patent Application Publication No. 2004-218055, Japanese Unexamined Patent Application Publication No. 2004-273205, etc. employ a method in which a paste containing metal nanoparticles is prepared by using a protective agent having a low molecular weight for facilitating the removal of the protective agent and preparing a complicated dispersion solution (organic solvent), the resultant paste is applied, and then the protective agent and the solvent are removed by heating or the like. However, in the present invention, the aqueous dispersion of the silver-containing structure described above is mixed with the compound (Z) having a functional group reactable with nitrogen atoms in the polyethyleneimine (a), and thus the charge on the surfaces of the silver nanoparticles is changed, thereby improving dispersion stability in the solvent. Further, the polyethyleneimine chain bonded to the compound having a functional group reactable with nitrogen atoms in the polyethyleneimine is separated from the surfaces of the silver nanoparticles by the removal of the solvent, thereby decreasing the fusion temperature of the silver paste. Therefore, the formed product is allowed to exhibit conductivity without using a complicated step such as solvent conversion or the like as described in Japanese Unexamined Patent Application Publication No. 2004-218055, Japanese Unexamined Patent Application Publication No. 2004-273205, etc. Further, the compound (X) remains in the coating film of the formed product, and thus adhesion to various substrates or the like is improved. Also, the added value of suppressing the occurrence of cracks, breakage, or the like in the coating film of the formed product is exhibited.

The formed product of the present invention contains an organic-inorganic composite produced by using the aqueous dispersion of the silver-containing structure containing the silver nanoparticles (Y) in a dispersion which is formed by the compound (X) having the polyethyleneimine (a) skeleton in a solvent, the compound (Z) having a functional group reactable with nitrogen atoms in the polyethyleneimine (a), and at least one compound (W) selected from the group consisting of the compound (w1) having an amine functional group and the compound (w2) having an amide functional group. In producing a formed product by using a silver paste, a complicated treatment or the like, such as exchange operation of various raw material components, has been performed for facilitating the removal of organic components. However, the present invention is majorly characterized by no need for such a complicated treatment and being provided with a low-temperature strong fusion mechanism without being influenced in the presence of various additives and other factors having influences on fusion. Further, the electrically conductive formed product containing the organic-inorganic composite produced by using the silver paste of present invention has the characteristics such as shape forming characteristics, film forming properties, adhesion, flexibility, etc. possessed by organic components in addition to the chemical, electric, magnetic, optical, and coloring agent characteristics, etc. possessed by the silver nanoparticles. The applications are not limited and can be realized in a very wide field, for example, applications to a catalyst, an electronic material, a magnetic material, an optical material, various sensors, a coloring material, medical examination, etc. In view of the point that the ratio of silver which can be contained can be easily adjusted, an effect according to purpose can be effectively exhibited, and there is high superiority as an industrial method because of substantially no need for a complicated step, accurate setting of conditions, and the like.

EXAMPLES

The present invention is described in further detail below by giving examples, but the present invention is not limited to these examples. In addition, "%" represents "% by mass" unless otherwise specified.

The devices and the like used in the examples below are as follows.

$^1$H-NMR: AL300, 300 Hz manufactured by JEOL Ltd.

TEM observation: JEM-2200FS manufactured by JEOL Ltd.

TGA measurement: TG/DTA6300 manufactured by SII Nano Technology Inc.

Plasmon absorption spectrum: UV-3500 manufactured by Hitachi, Ltd.

Volume resistivity: Loresta GP MCP-T600 manufactured by Mitsubishi Chemical Corporation Synthesis Example <Synthesis of Compound (x1) and Aqueous Dispersion of Silver-Containing Structure>

[Tosylation Reaction of Polyethylene Glycol]

In a nitrogen atmosphere, a chloroform (30 ml) solution containing 9.6 g (50.0 mmol) of p-toluenesulfonic acid chloride was added dropwise to a mixed solution of 20.0 g (10.0 mmol) of methoxypolyethylene glycol [Mn=2,000], 8.0 g (100.0 mmol) of pyridine, and 20 ml of chloroform under ice cooling and stirring for 30 minutes. After the completion of addition, the resultant mixture was further stirred for 4 hours at a bath temperature of 40° C. After the completion of reaction, the reaction solution was diluted by adding 50 ml of chloroform. Then, the reaction solution was washed with 100 ml of a 5% aqueous hydrochloric acid solution, 100 ml of a saturated aqueous sodium hydrogen carbonate solution, and 100 ml of a saturated aqueous saline solution in that order, and then dried with magnesium sulfate, filtered, and concentrated under reduced pressure. The resultant solid was washed several times with hexane, filtered off, and dried under reduced pressure at 80° C. to produce 22.0 g of a tosylated product.

The results of $^1$H-NMR measurement of the resultant product are shown below.

Results of $^1$H-NMR (CDCl$_3$) measurement:

δ (ppm): 7.82 (d), 7.28 (d), 3.74-3.54 (bs), 3.41 (s), 2.40 (s)

[Synthesis of Compound (x1)]

In a nitrogen atmosphere, 5.39 g (2.5 mmol) of the methoxypolyethylene glycol compound having a p-toluenesulfonyloxy group at an end and synthesized as described above, 20.0 g (0.8 mmol) of branched polyethyleneimine (manufactured by Aldrich Co., Ltd., molecular weight, 25,000), 0.07 g of potassium carbonate, and 100 ml of N,N-dimethylacetamide were stirred at 100° C. for 6 hours. Then, 300 ml of a mixed solution (V/V=1/2) of ethyl acetate and hexane was added to the resultant reaction mixture and strongly stirred at room temperature, and then a solid product was filtered off. The solid was washed two times with 100 ml of a mixed solution (V/V=1/2) of ethyl acetate and hexane and then dried under reduced pressure to produce 24.4 g of a solid of compound (x1) in which polyethylene glycol was bonded to branched polyethyleneimine.

The results of $^1$H-NMR measurement of the resultant product are shown below.

Results of $^1$H-NMR (CDCl$_3$) measurement:

δ (ppm): 3.50 (s), 3.05-2.20 (m)

[Synthesis of Aqueous Dispersion of Silver-Containing Structure]

First, 10.0 g of silver oxide was added to 138.8 g of an aqueous solution using 0.592 g of the compound (x1) produced as described above and then stirred at 25° C. for 30 minutes. Then, 46.0 g of dimethylethanolamine was gradually added under stirring to change the reaction solution to black-red. Although heat was slightly generated, the reaction solution was allowed to stand and stirred at 25° C. for 30 minutes. Then, 15.2 g of a 10% aqueous ascorbic acid solution was gradually added to the reaction solution under stirring. Stirring was further continued for 20 hours while maintaining the temperature to produce a black-red dispersion.

After the completion of reaction, a mixed solvent of 200 ml of isopropyl alcohol and 200 ml of hexane was added to the resultant dispersion, and the resultant mixture was stirred for 2 minutes and then centrifugally concentrated for 5 minutes at 3000 rpm. After the supernatant was removed, a mixed solvent of 50 ml of isopropyl alcohol and 50 ml of hexane was added to the resultant precipitate, and then the resultant mixture was stirred for 2 minutes and centrifugally concentrated for 5 minutes at 3000 rpm. After the supernatant was removed, 20 g of water was added to the resultant precipitate and stirred for 2 minutes, and then the organic solvent was removed under reduced pressure to produce an aqueous dispersion of a silver-containing structure.

The resultant dispersion was sampled, and a visible absorption spectrum of a 10-fold diluted solution was measured. As a result, a plasmon absorption spectrum peak was observed at 400 nm, and thus the production of silver nanoparticles was confirmed. Also, spherical silver nanoparticles (average particle diameter of 17.5 nm) were confirmed by TEM observation. As a result of measurement of the silver content in the solid using TG-DTA, the silver content of 97.2% was shown.

In examples below, a conductive ink having a composition below was prepared as an example showing the effect of the present invention.

<Composition of Conductive Ink>

Silver solid content: 30%

Glycerin: 2%

Surfynol 465 (ethoxylated acetylenediol, manufactured by Nisshin Chemical Industry Co., Ltd.): 0.01%

Example 1

A mixture of nitric acid corresponding to 1.2% by weight of silver content and ethylamine corresponding to 8.5% by weight of silver content was added to an aqueous dispersion of the silver-containing structure produced in the synthesis example described above, and the resultant mixture was stirred to prepare a silver paste. Then, Surfynol 465 (ethoxylated acetylenediol (nonionic surfactant), manufactured by Nisshin Chemical Industry Co., Ltd.) was added to the silver paste to produce a conductive ink, which was then placed on each of two glass plates and applied by a spin coater to form two silver films. The silver films were dried at room temperature for 5 minutes and heated at 125° C. for 30 minutes, and then volume resistivity was measured at 3 positions for each of the glass plates by a four-terminal method. Table 1 shows the volume resistivity values at six positions and an average value.

Example 2

The same treatment and measurement of volume resistivity as in Example 1 were performed except that diethylamine was used in place of ethylamine in Example 1. Table 1 shows the volume resistivity values at six positions and an average value.

Example 3

The same treatment and measurement of volume resistivity as in Example 1 were performed except that triethylamine was used in place of ethylamine in Example 1. Table 1 shows the volume resistivity values at six positions and an average value.

Example 4

The same treatment and measurement of volume resistivity as in Example 1 were performed except that N,N-dimethylacetamide was used in place of ethylamine in Example 1. Table 1 shows the volume resistivity values at six positions and an average value.

Example 5

A mixture of nitric acid corresponding to 0.8% by weight of silver content and dimethylaminoethanol corresponding to 5.8% by weight of silver content was added to an aqueous dispersion of the silver-containing structure produced in the synthesis example described above, and the resultant mixture was stirred to prepare a silver paste. Then, glycerin and Surfynol 465 (ethoxylated acetylenediol (nonionic surfactant), manufactured by Nisshin Chemical Industry Co., Ltd.) were added to the silver paste to produce a conductive ink which was then placed on each of two glass plates and applied by a spin coater to form two silver films. The silver films were dried at room temperature for 5 minutes and heated at 125° C. for 30 minutes, and then volume resistivity was measured at 3 positions for each of the glass plates by a four-terminal method. Table 1 shows the volume resistivity values at six positions and an average value.

Example 6

The same treatment and measurement of volume resistivity as in Example 5 were performed except that in Example 5, the amount of nitric acid added was 1.0% by weight, and the amount of dimethylaminoethanol added was 1.7% by weight. Table 1 shows the volume resistivity values at six positions and an average value.

Example 7

The same treatment and measurement of volume resistivity as in Example 5 were performed except that in Example 5, the amount of nitric acid added was 1.2% by weight, and the amount of dimethylaminoethanol added was 8.4% by weight. Table 1 shows the volume resistivity values at six positions and an average value.

Example 8

The same treatment and measurement of volume resistivity as in Example 5 were performed except that in Example 5, the amount of nitric acid added was 1.3% by weight, and the amount of dimethylaminoethanol added was 5.4% by weight. Table 1 shows the volume resistivity values at six positions and an average value.

TABLE 1

(Unit: $\mu\Omega \cdot cm$)

| | Example | | | | | | | |
|---|---|---|---|---|---|---|---|---|
| | 1 | 2 | 3 | 4 | 5 | 6 | 7 | 8 |
| 1 | 10.4 | 7.09 | 49.6 | 5.67 | 9.63 | 11.7 | 5.04 | 6.46 |
| 2 | 5.68 | 7.43 | 22.4 | 4.95 | 11.0 | 11.9 | 5.07 | 5.58 |
| 3 | 4.53 | 6.28 | 5.13 | 4.35 | 9.84 | 7.32 | 6.13 | 4.81 |
| 4 | 6.10 | 4.88 | 5.63 | 5.13 | 8.71 | 7.17 | 5.24 | 3.66 |
| 5 | 5.66 | 5.05 | 5.19 | 6.07 | 10.2 | 6.30 | 6.33 | 5.50 |
| 6 | 3.77 | 5.98 | 4.57 | 4.89 | 9.15 | 5.64 | 5.07 | 5.31 |
| Average | 6.02 | 6.12 | 15.4 | 5.18 | 9.76 | 8.34 | 5.48 | 5.22 |

Comparative Example 1

The same treatment and measurement of volume resistivity as in Example 5 were performed except that in Example 5, the amount of nitric acid added was 1.1% by weight, and the amount of dimethylaminoethanol added was 0.9% by weight. Table 2 shows the volume resistivity values at six positions and an average value.

Comparative Example 2

The same treatment and measurement of volume resistivity as in Example 5 were performed except that in Example 5, the amount of nitric acid added was 1.3% by weight, and the amount of dimethylaminoethanol added was 9.4% by weight. Table 2 shows the volume resistivity values at six positions and an average value.

TABLE 2

(Unit: $\mu\Omega \cdot cm$)

| | Comparative Example | |
|---|---|---|
| | 1 | 2 |
| 1 | 34.2 | 6.45 |
| 2 | 877000 | 59.7 |
| 3 | 34400 | 8.01 |
| 4 | 141 | 8.86 |
| 5 | 1470000 | 453 |
| 6 | 294000 | 5.29 |
| Average | 446000 | 90.2 |

The examples indicate that the silver paste produced by adding the compound (W) to the aqueous dispersion of the silver-containing structure shows excellent volume resistivity values. Further, comparison between the examples and the comparative examples indicates that a more excellent effect can be obtained by using the compound (W) so that the addition amount is 1.0% to 9.0% by weight relative to the silver solid content in the aqueous dispersion.

The invention claimed is:

1. A silver paste comprising:
an aqueous dispersion of a silver-containing structure containing, as main constituent components,
at least one compound (X) selected from the group consisting of
a compound (x1) containing polyethyleneimine (a) having a number-average molecular weight of 500 to 50,000 and an amino group to which polyethylene glycol (b) having a number-average molecular weight of 500 to 5,000 is bonded,
a compound (x2) containing polyethyleneimine (a) having a number-average molecular weight of 500 to 50,000 and an amino group to which a linear epoxy resin (c) is bonded, and
a compound (x3) containing polyethyleneimine (a) having a number-average molecular weight of 500 to 50,000 and an amino group to which polyethylene glycol (b) having a number-average molecular weight of 500 to 5,000 and a linear epoxy resin (c) are bonded, and
silver nanoparticles (Y);
a compound (Z) having a functional group reactable with a nitrogen atom in the polyethyleneimine (a); and
at least one compound (W) selected from the group consisting of a compound (w1) having an amine functional group and a compound (w2) having an amide functional group,
wherein the compound (W) is used in an amount of 1.0% to 9.0% by weight relative to a silver solid content in the aqueous dispersion.

2. The silver paste according to claim 1, wherein the fusion temperature in a dry state of the silver paste is within a range of 100° C. to 150° C.

3. The silver paste according to claim 1, wherein the compound (Z) is at least one compound selected from the group consisting of an aldehyde compound, an epoxy compound, an acid anhydride, a carboxylic acid, and an inorganic acid.

4. The silver paste according to claim 1, wherein the compound (Z) is an inorganic acid.

5. The silver paste according to claim 1, wherein the compound (W) is at least one compound selected from the group consisting of a water-soluble amine compound, a water-soluble alcoholamine compound, and a water-soluble amide compound.

6. An electrically conductive product comprising a coating film provided on a solid substrate and having a fusion temperature of 100° C. to 150° C., the coating film containing:
at least one compound (X) selected from the group consisting of
a compound (x1) containing polyethyleneimine (a) having a number-average molecular weight of 500 to 50,000 and an amino group to which polyethylene glycol (b) having a number-average molecular weight of 500 to 5,000 is bonded,
a compound (x2) containing polyethyleneimine (a) having a number-average molecular weight of 500 to 50,000 and an amino group to which a linear epoxy resin (c) is bonded, and
a compound (x3) containing polyethyleneimine (a) having a number-average molecular weight of 500 to 50,000 and an amino group to which polyethylene glycol (b) having a number-average molecular weight of 500 to 5,000 and a linear epoxy resin (c) are bonded; and
silver nanoparticles (Y);
a compound (Z) having a functional group reactable with a nitrogen atom in the polyethyleneimine (a); and at least one compound (W) selected from the group consisting of a compound (w1) having an amine functional group and a compound (w2) having an amide functional group, wherein the compound (W) is contained in an amount of 1.0% to 9.0% by weight relative to a silver solid content in the aqueous dispersion.

7. The electrically conductive product according to claim 6, wherein the compound (Z) is at least one compound selected from the group consisting of an aldehyde compound, an epoxy compound, an acid anhydride, a carboxylic acid, and an inorganic acid.

8. The electrically conductive product according to claim 6, wherein the compound (Z) is an inorganic acid.

9. The electrically conductive product according to claim 6, wherein the compound (W) is at least one compound selected from the group consisting of a water-soluble amine compound, a water-soluble alcoholamine compound, and a water-soluble amide compound.

10. The electrically conductive product according to claim 6, wherein the glass transition temperature of the solid substrate is 180° C. or less.

* * * * *